United States Patent [19]

Mori et al.

[11] Patent Number: 5,006,707
[45] Date of Patent: Apr. 9, 1991

[54] ELECTRON MICROSCOPE IMAGE RECORDING AND READ-OUT METHOD

[75] Inventors: Nobufumi Mori; Masahiro Ohnishi; Junji Miyahara, all of Kanagawa; Tetsuo Oikawa; Yoshiyasu Harada, both of Tokyo, all of Japan

[73] Assignees: Fuji Photo Film Co., Ltd.; Jeol Ltd., both of Tokyo, Japan

[21] Appl. No.: 467,479

[22] Filed: Jan. 19, 1990

[30] Foreign Application Priority Data

Jan. 24, 1989 [JP] Japan ................................ 1-14770

[51] Int. Cl.$^5$ ...................... H01J 37/147; H01J 37/26
[52] U.S. Cl. .................................. 250/311; 250/327.2
[58] Field of Search ................ 250/310, 311, 327.2 C, 250/327.2 G, 337

[56] References Cited

U.S. PATENT DOCUMENTS

| | | | |
|---|---|---|---|
| 4,258,264 | 3/1981 | Kotera et al. | 250/484 |
| 4,276,473 | 6/1981 | Kato et al. | 250/337 |
| 4,315,318 | 2/1982 | Kato et al. | 250/337 |
| 4,387,428 | 6/1983 | Ishida et al. | 250/337 |
| 4,651,220 | 3/1987 | Hosoi et al. | 250/311 |
| 4,694,171 | 9/1987 | Hosoi et al. | 250/311 |
| 4,814,618 | 3/1989 | Saito et al. | 250/327.2 G |
| 4,896,038 | 1/1990 | Nakajima | 250/327.2 G |
| 4,904,867 | 2/1990 | Adachi | 250/327.2 G |
| 4,922,098 | 5/1990 | Mori et al. | 250/311 |

FOREIGN PATENT DOCUMENTS

56-11395 2/1981 Japan .

*Primary Examiner*—Jack I. Berman
*Assistant Examiner*—Kiet T. Nguyen
*Attorney, Agent, or Firm*—Sughrue, Mion, Zinn, Macpeak & Seas

[57] ABSTRACT

Each of two-dimensional sensors is exposed to an electron beam, which has passed through a sample, in a vacuum in order to store the energy from the electron beam on the two-dimensional sensor, and is then exposed to light or heat in order to release the stored energy as emitted light. The emitted light is photoelectrically detected and an image signal is thereby obtained which represents an electron microscope image of the sample. Read-out conditions which are to be used when the emitted light is detected are determined from an electron beam exposure amount which was set when the energy from the electron beam was stored on each two-dimensional sensor. Signals representing the read-out conditions determined for the two-dimensional sensors are stored in a storage device so that it is clear which read-out conditions correspond to which two-dimensional sensor. When light emitted by a two-dimensional sensor is to be detected, a signal which represents the read-out conditions corresponding to the two-dimensional sensor is read from the storage device, and the read-out conditions are set.

13 Claims, 3 Drawing Sheets

ELECTRON MICROSCOPE IMAGE RECORDING AND READ-OUT METHOD

BACKGROUND OF THE INVENTION

1. Field of the Invention

This invention relates to a method for recording an electron microscope image and reading out the recorded electron microscope image. This invention particularly relates to an electron microscope image recording and read-out method wherein an electron microscope image is recorded with a high sensitivity, and the recorded electron microscope image is read out as an electric signal which can then be subjected to various types of image processing.

2. Description of the Prior Art

There have heretofore been known electron microscopes wherein an electron beam which has passed through a sample is refracted with an electric field or a magnetic field in order to obtain an enlarged image of the sample. A diffraction pattern of a sample is formed on a back focal plane of an objective lens in the electron microscope as a result of the passage of the electron beam through the sample, and an enlarged image of the sample is formed by interference of the diffracted waves. Therefore, the enlarged image (scattering image) of the sample may be projected with a projection lens so that it can be observed. Also, if the diffraction pattern on the back focal plane is projected, an enlarged diffraction pattern of the sample may be observed. If an intermediate lens is disposed between the objective lens and the projection lens and the focal length of the intermediate lens is adjusted, the aforesaid enlarged image (scattering image) or the diffraction pattern may be observed as desired.

In general, in order for the enlarged image or the diffraction pattern (both the enlarged image and the diffraction pattern will hereinafter be generically referred to as the electron beam image) to be viewed, photographic film has heretofore been disposed at the plane, on which the projection lens forms the image, in order to expose the photographic film to the electron beam image. Alternatively, an image intensifier has heretofore been used in order to intensify and project the electron beam image. As another alternative, a fluorescent screen has heretofore been used in order to convert the electron beam image into a visible image. The visible image is recorded with a television camera. However, the method wherein photographic film is used has a drawback in that the sensitivity of the photographic film with respect to the electron beam is low and the development process is therefore difficult. The method wherein the image intensifier or the television camera is used is also disadvantageous in that image sharpness is low and the image is readily distorted.

Also, the electron beam image is often subjected to image processing such as gradation processing; frequency response enhancement processing; density processing; subtraction processing or addition processing; reconstruction of a three-dimensional image by Fourier analysis; image analysis for image conversion into a binary image or for grain size measurement; or diffraction pattern processing for analyzing crystals or for measurement of the grating constant, transition and grating defects. In such cases, a microscope image recorded on photographic film has heretofore been detected with a microphotometer and converted into an electric signal, which is then subjected to A/D conversion or the like and processed with a computer. Performing such operations is very troublesome.

In view of the above circumstances, the applicant proposed in U.S. Pat. No. 4,651,220 and U.S. patent application Ser. No. 251,982 a novel method for recording and reproducing an electron microscope image wherein the electron microscope image is recorded and reproduced with a high sensitivity and with good image quality, and wherein an electric signal representing the electron microscope image is directly obtained so that various kinds of processing are facilitated. Basically, the proposed method for recording and reproducing an electron microscope image comprises the steps of (i) exposing a two-dimensional sensor, such as a stimulable phosphor sheet, which is capable of storing energy from an electron beam thereon, to an electron beam which has passed through a sample in a vacuum in order to store the energy from the electron beam on the two-dimensional sensor, (ii) thereafter exposing the two-dimensional sensor to light or heat in order to release the stored energy in the form of emitted light, (iii) photoelectrically detecting the emitted light in order to obtain an image signal, and (iv) using the image signal in order to reproduce an electron beam image of the sample.

The aforesaid two-dimensional sensor is constituted of a material which is capable of temporarily storing at least part of the energy from an electron beam thereon when exposed to the electron beam, and then releasing at least part of the stored energy in a detectable form such as light, electricity or sound upon excitation by an exterior source. As the two-dimensional sensor, stimulable phosphor sheets as disclosed in, for example, U.S. Pat. Nos. 4,258,264, 4,276,473, 4,315,318 and 4,387,428, and Japanese Unexamined Patent Publication No. 56(1981)-11395 are particularly suitable. Specifically, when certain kinds of phosphors are exposed to radiation such as an electron beam, they store part of the energy of the radiation. Then, when the phosphor which has been exposed to radiation is exposed to stimulating rays such as visible light, the phosphor emits light in proportion to the amount of energy stored thereon during its exposure to the radiation. A phosphor exhibiting such properties is referred to as a stimulable phosphor. The term "stimulable phosphor sheet" as used herein means a sheet-like recording material comprising the aforesaid stimulable phosphor. In general, a stimulable phosphor sheet is composed of a supporting material and a stimulable phosphor layer overlaid on the supporting material. The stimulable phosphor layer comprises an appropriate binder and the stimulable phosphor dispersed therein. In cases where the stimulable phosphor layer is self-supporting, the stimulable phosphor layer can form the stimulable phosphor sheet by itself. Examples of stimulable phosphors for constituting the stimulable phosphor sheet are described in detail in U.S. Pat. No. 4,651,220.

As the two-dimensional sensor, it is also possible to use a thermal phosphor sheet as disclosed in, for example, Japanese Patent Publication Nos. 55(1980)-47719 and 55(1980)-47720. A thermal phosphor sheet is composed of a sheet-like recording material comprising a phosphor (thermal phosphor) which is caused mainly by the effect of heat to release energy, which was stored thereon during its exposure to radiation, as thermal fluorescence.

With the aforesaid method for recording and reproducing an electron microscope image wherein an electron microscope image is stored on a two-dimensional sensor such as a stimulable phosphor sheet, the electron microscope image can be recorded with a high sensitivity. Therefore, the energy of the electron beam used to record the electron microscope image can be decreased, and damage to the sample can be minimized. Also, with this method for recording and reproducing an electron microscope image, it becomes very easy to carry out image processing, such as gradation processing and frequency response enhancement processing, on the electron microscope image. Also, when the electric signal is fed into a computer, it becomes possible quickly and simply to carry out diffraction pattern processing, reconstruction of a three-dimensional image, and image analysis for image conversion into a binary image or the like.

In the aforesaid method for recording and reproducing an electron microscope image, it is desirable for a visible electron microscope image to be reproduced which has good image quality and which can serve as an effective tool in, particularly, the efficient and accurate analysis of a sample. For this purpose, in the course of reading out an electron microscope image from a two-dimensional sensor (i.e. in the course of detecting light emitted by the two-dimensional sensor), read-out conditions such as a read-out gain and a scale factor (latitude) should be set to values suitable for the image input information stored on the two-dimensional sensor. In order to satisfy this requirement, the method disclosed in, for example, Japanese Unexamined Patent Publication No. 62(1987)-222556, will be considered, in which method a preliminary read-out operation (hereinafter referred to as the "preliminary readout") is carried out. Specifically, before a final read-out operation (hereinafter referred to as the "final readout") is carried out in order to obtain an image signal which is used to reproduce a visible electron microscope image, a preliminary readout is conducted in order approximately to ascertain the electron microscope image stored on the two-dimensional sensor. On the basis of the approximately ascertained information about the electron microscope image, the read-out conditions for the final readout and/or image processing conditions for the processing of the image signal obtained from the final readout are set. In this manner, a visible electron microscope image having the best possible image quality can be reproduced.

However, in cases where the preliminary readout is carried out, it takes a long time to carry out the whole read-out operation. Also, because a mechanism for the preliminary readout must be provided, the read-out apparatus becomes complicated. Additionally, in cases where a plurality of two-dimensional sensors are subjected to the preliminary readout and the final readout, unless the preliminary readout carried out for a certain two-dimensional sensor is always associated with the final readout carried out for the same two-dimensional sensor, a problem will occur in that read-out conditions, which have been determined on the basis of information obtained from the preliminary readout carried out for a certain two-dimensional sensor, may be set for a final readout which is carried out on a different two-dimensional sensor. Therefore, in cases where a preliminary readout is carried out, two-dimensional sensors must be managed very carefully in the course of reading out electron microscope images. Performing such management functions is troublesome.

SUMMARY OF THE INVENTION

The primary object of the present invention is to provide an electron microscope image recording and read-out method wherein, in the course of reading out an electron microscope image from a two-dimensional sensor, the read-out conditions can be set accurately and easily.

Another object of the present invention is to provide an electron microscope image recording and read-out method wherein an electron microscope image is quickly read-out from a two-dimensional sensor.

The electron microscope image recording and read-out method in accordance with the present invention is based on the finding that image input information stored on a two-dimensional sensor corresponds to the electron beam exposure amount (i.e. current of electron beam x shutter open time) which is set in the course of recording an electron microscope image on the two-dimensional sensor.

Specifically, the present invention provides an electron microscope image recording and read-out method wherein each of two-dimensional sensors capable of storing energy from an electron beam thereon is exposed to an electron beam, which has passed through a sample, in a vacuum in order to store the energy from the electron beam on the two-dimensional sensor, thereafter the two-dimensional sensor is exposed to light or heat in order to release the stored energy as emitted light, and the emitted light is photoelectrically detected in order to obtain an image signal which represents an electron microscope image of the sample, wherein the improvement comprises the steps of:

(i) for each of said two-dimensional sensors, determining read-out conditions, which are to be used in the course of detecting the emitted light, on the basis of an electron beam exposure amount which was set in the course of storing the energy from said electron beam on said two-dimensional sensor, (ii) storing signals, which represent the read-out conditions determined for the respective two-dimensional sensors, in a storage means so that it is clear which read-out conditions correspond to which two-dimensional sensor, and (iii) in the course of exposing a two-dimensional sensor to light or heat and detecting the light emitted by said two-dimensional sensor, reading a signal, which represents the read-out conditions corresponding to said two-dimensional sensor, from said storage means, and setting said read-out conditions when the light emitted by said two-dimensional sensor is being detected.

With the electron microscope image recording and read-out method in accordance with the present invention, for each of a plurality of two-dimensional sensors, the read-out conditions to be used in the course of detecting light emitted by the two-dimensional sensor are determined on the basis of an electron beam exposure amount which is set when an electron microscope image is stored on the two-dimensional sensor. Thereafter, signals which represent the read-out conditions determined for the respective two-dimensional sensors are stored in the storage means so that it is clear which read-out conditions correspond to which two-dimensional sensor. When an electron microscope image is read out from a two-dimensional sensor, a signal which represents the read-out conditions corresponding to the two-dimensional sensor is read from the storage means, and the read-out conditions are put into effect for the two-dimensional sensor. Therefore, with the electron microscope image recording and read-out method in accordance with the present invention, the read-out operation can be carried out quickly. Also, the read-out conditions suitable for each two-dimensional sensor can be determined easily without the preliminary readout having to be carried out.

DESCRIPTION OF THE PREFERRED EMBODIMENTS

The present invention will hereinbelow be described in further detail with reference to the accompanying drawings.

Figure 2:
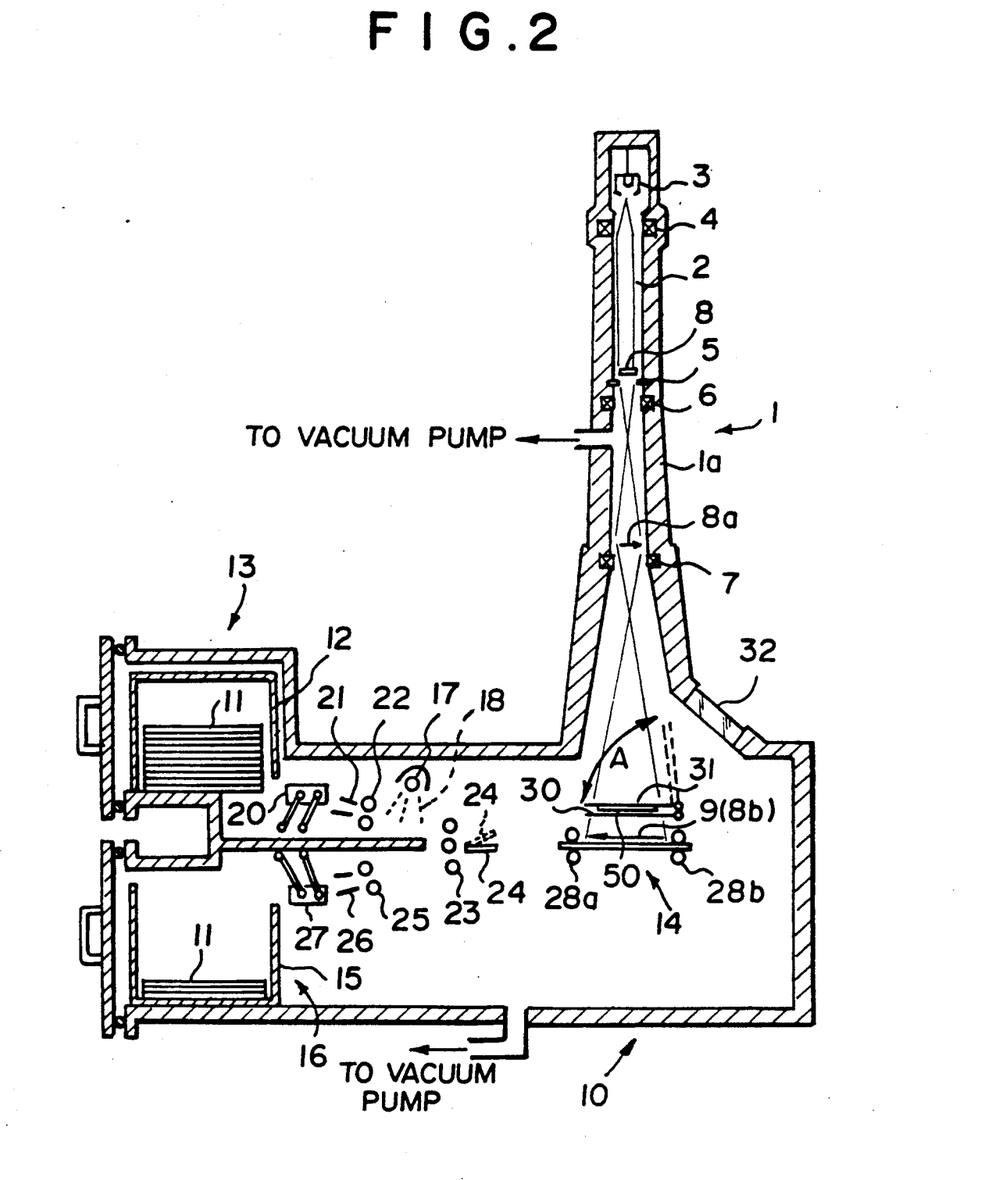
FIG. 2 is a schematic side view showing an electron microscope image recording apparatus in the electron microscope image recording and reproducing system of FIG. 1.

First, how electron microscope images are stored on two-dimensional sensors will be described below with reference to FIG. 2. A microscope body 1a of an electron microscope 1 is provided with an electron gun 3 for emitting an electron beam 2 at a uniform speed, at least one converging lens 4 for converging the electron beam 2 onto a sample plane, a sample supporting base 5, an objective lens 6 of the same type as the converging lens 4, and a projection lens 7. The electron beam 2 passing through a sample 8 disposed on the sample supporting base 5 is refracted by the objective lens 6, which forms an enlarged scattering image 8a of the sample 8. The enlarged scattering image 8a is projected by the projection lens 7, and an image 8b forms at a plane of image formation 9.

An electron microscope image recording apparatus 10 is disposed under the microscope body 1a. The electron microscope image recording apparatus 10 is provided with a sensor feed section 13 which is located at the left part and which houses a feed magazine 12. The feed magazine 12 accommodates a plurality of stimulable phosphor sheets 11, 11, . . . which serve as two-dimensional sensors. A sensor receiving section 16, which houses a receiving magazine 15 of the same type as the feed magazine 12, is located below the sensor feed section 13. A recording section 14 is located at a position including the plane of image formation 9. Also, an erasing light source 17 is located between the recording section 14 and the sensor feed section 13.

After the feed magazine 12 is fitted into the sensor feed section 13, the stimulable phosphor sheets 11, 11, . . . accommodated in the feed magazine 12, are taken one after another out of the feed magazine 12 by, for example, a sheet feed-in arm 20 which grasps the edge of a stimulable phosphor sheet 11. A stimulable phosphor sheet 11 thus taken out of the feed magazine 12 is guided by a pair of guide plates 21, 21, and fed into the recording section 14 by a pair of sheet feed-in rollers 22, 22, feed-in and feed-out rollers 23, 23, 23, a pair of feed-in and feed-out rollers 28a, 28a, and a pair of feed-in and feed-out rollers 28b, 28b. At this time, a guide plate 24 is located a the position indicated by the solid line. After an electron microscope image is stored on the stimulable phosphor sheet 11 in the recording section 14, the pair of feed-in and feed-out rollers 28a, 28a and the pair of feed-in and feed-out rollers 28b, 28b rotate in directions reverse to the directions in which they rotated when feeding the stimulable phosphor sheet 11 into the recording section 14. At this time, the guide plate 24 is located at the position indicated by the broken line. The stimulable phosphor sheet 11 is then moved by the feed-in and feed-out rollers 23, 23, 23 and a pair of sheet feed-out rollers 25, 25, and guided by a pair of guide plates 26, 26. Thereafter, the stimulable phosphor sheet 11 is introduced into the receiving magazine 15, which is located in the sensor receiving section 16, by a sheet feed-out arm 27 of the same type as the sheet feed-in arm 20.

A shutter 30 and a fluorescent screen 31 which are rotatable by levers (not shown) in the directions indicated by the double-headed arrow A are provided between the microscope body 1a and the recording section 14. An inspection window 32 provided with a lead glass or the like is formed in the circumferential wall of the microscope body 1a above the fluorescent screen 31.

During the operation of the electron microscope 1, a vacuum is maintained inside of the microscope body 1a and inside of the electron microscope image recording apparatus 10 by a known evacuation device. A known shielding member (not shown) is provided between the microscope body 1a and the electron microscope image recording apparatus 10 in order to shield the inside of the microscope body 1a and the inside of the electron microscope image recording apparatus 10 from each other. Therefore, a vacuum is maintained inside of the microscope body 1a even when the vacuum in the electron microscope image recording apparatus 10 is broken at the time the feed magazine 12 is fed into the electron microscope image recording apparatus 10 and the receiving magazine 15 is taken out of the electron microscope image recording apparatus 10.

When electron microscope images are to be stored on stimulable phosphor sheets 11, 11, . . . , the feed magazine 12 which accommodates a plurality of stimulable phosphor sheets 11, 11, . . . is fitted into the sensor feed section 13, and an empty receiving magazine 15 is fitted into the sensor receiving section 16. Also, the shutter 30 and the fluorescent screen 31 are rotated by the levers to positions (horizontal positions in FIG. 2) at which they intercept the electron beam 2. Thereafter, the lowest stimulable phosphor sheet 11 among the stimulable phosphor sheets 11, 11, . . . accommodated in the feed magazine 12 is fed into the recording section 14 by the sheet feed-in arm 20, the pair of sheet feed-in rollers 22, 22, feed-in and feed-out rollers 23, 23, 23, the pair of feed-in and feed-out rollers 28a, 28a, and the pair of feed-in and feed-out rollers 28b, 28b. As the stimulable phosphor sheet 11 is fed into the recording section 14, the erasing light source 17 is turned on so that any energy remaining on the stimulable phosphor sheet 11 will be released. When the stimulable phosphor sheet 11 arrives at the plane of image formation 9, the pair of feed-in and feed-out rollers 28a, 28a and the pair of feed-in and feed-out rollers 28b, 28b stop and support the stimulable phosphor sheet 11 at the plane of image formation 9.

The electron beam 2 impinges upon the fluorescent screen 31 and causes it to produce fluorescence, and therefore the enlarged scattering image 8a which the electron beam 2 carries can be viewed through the inspection window 32. After the focusing point, the magnification and the field range of the enlarged scattering image 8a are adjusted by an operator viewing the fluorescent screen 31 through the inspection window 32, the shutter 30 and the fluorescent screen 31 are rotated by the levers to positions in which they do not intercept the electron beam 2. Accordingly, electron beam 2 impinges upon the stimulable phosphor sheet 11 located in the recording section 14, and energy from the electron beam 2 carrying the enlarged scattering image 8b is stored on the stimulable phosphor sheet 11.

After the stimulable phosphor sheet 11 is exposed to the electron beam 2, the shutter 30 is closed. The the stimulable phosphor sheet 11, on which the enlarged scattering image 8b has been stored, is introduced into the receiving magazine 15 by the pair of feed-in and feed-out rollers 28a, 28a, the pair of feed-in and feed-out rollers 28b, 28b, the feed-in and feed-out rollers 23, 23, 23, the pair of sheet feed-out rollers 25, 25, and the sheet feed-out arm 27.

The operation described below is repeated, and a plurality of stimulable phosphor sheets 11, 11, . . . , on which electron microscope images have been stored, are accommodated in the receiving magazine 15. Thereafter, the receiving magazine 15 is taken out of the sensor receiving section 16 and sent to an electron microscope image read-out apparatus 80, which will be described later.

In the course of sequentially storing the electron microscope images on a plurality of stimulable phosphor sheets 11, 11, . . . in the manner described above, read-out conditions suitable for each stimulable phosphor sheet 11 are determined. How the read-out conditions are determined will hereinbelow be described with reference to FIGS. 1 and 2. The fluorescent screen 31 of the electron microscope 1 is provided with an electron beam detector 50. The electron beam detector 50 detects the mean current of the electron beam 2, which impinges upon the fluorescent screen 31 before it impinges upon a stimulable phosphor sheet 11, and generates a signal D1 representing the mean current. The signal D1 is fed into a read-out condition determining circuit 51. Also, the electron microscope 1 is provided with an exposure time setting device 52, which generates a signal D2 representing the time for which the shutter 30 is kept open (i.e. the shutter open time). The signal D2 is fed into the read-out condition determining circuit 51. The electron beam exposure amount, which is calculated by multiplying the mean current by the shutter open time, corresponds to the electron microscope image information stored on the stimulable phosphor sheet 11. Therefore, on the basis of the electron beam exposure amount (i.e. the product of the current, which is represented by the signal D1, and the shutter open time which is represented by the signal D2), the read-out condition determining circuit 51 calculates the read-out conditions, i.e. a read-out gain Sk and a scale factor Gp which are suitable for the stimulable phosphor sheet 11. Predetermined programs are used for this purpose. A signal D3, which represents the read-out gain Sk and the scale factor Gp, is fed into a condition writing device 53 combined integrally with the electron microscope 1. On the basis of the signal D3, the condition writing device 53 writes the signal, which represents the read-out gain Sk and the scale factor Gp, on a storage card 54 such as an IC card, a magnetic card, or a laser beam storage card.

Figure 1:
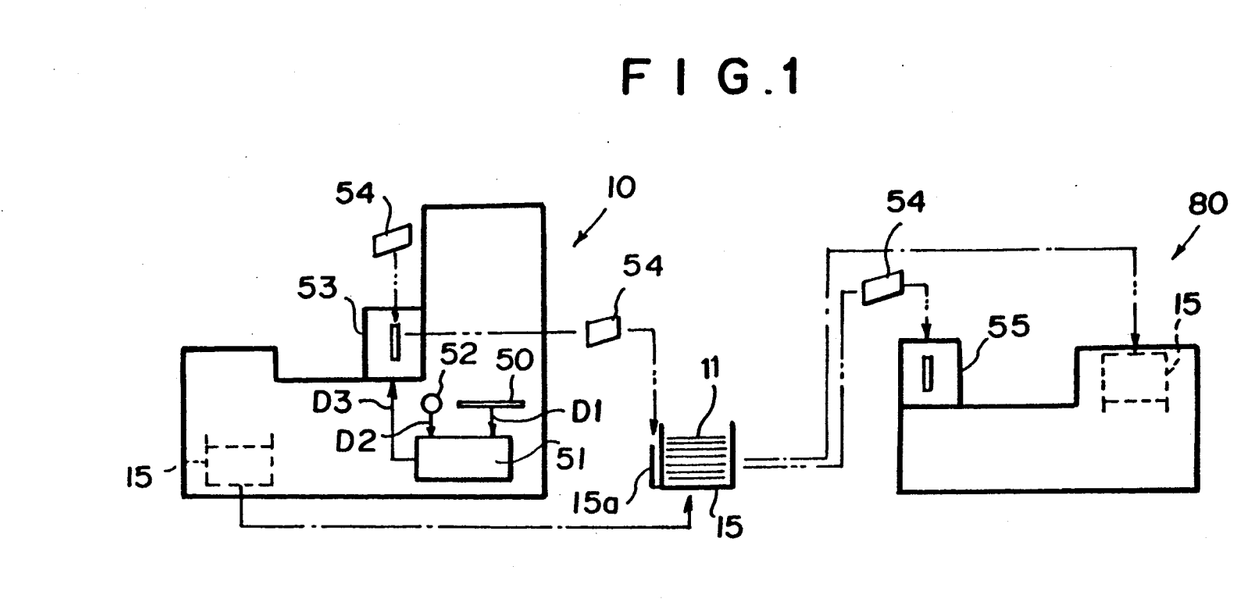
FIG. 1 is a schematic view showing an electron microscope image recording and reproducing system wherein an embodiment of the electron microscope image recording and read-out method in accordance with the present invention is employed.

The determination of the read-out conditions and the writing of the signal representing the read-out conditions are carried out each time a stimulable phosphor sheet 11 is fed from the feed magazine 12 and an electron microscope image is stored thereon. Therefore, the signals which represent the read-out conditions for the respective stimulable phosphor sheets 11, 11, . . . are written on the storage card 54 in the order in which the electron microscope images were recorded on the stimulable phosphor sheets 11, 11, . . . , i.e. in the order in which the stimulable phosphor sheets 11, 11, . . . were accommodated in the receiving magazine 15.

When the receiving magazine 15, in which a plurality of stimulable phosphor sheets 11, 11, . . . having the electron microscope images stored thereon have been accommodated, is taken out of the sensor receiving section 16, the storage card 54 is also taken out of the condition writing device 53 and put into, for example, a pocket 15a located on a side of the receiving magazine 15. The receiving magazine 15 is then fitted into the electron microscope image read-out apparatus 80. At this time, the storage card 54 is taken out of the receiving magazine 15, and fitted into a condition reading device 55 which is combined integrally with the electron microscope image read-out apparatus 80. How an electron microscope image is read out from a stimulable phosphor sheet 11 will hereinbelow be described with reference to FIG. 3.

Figure 3:
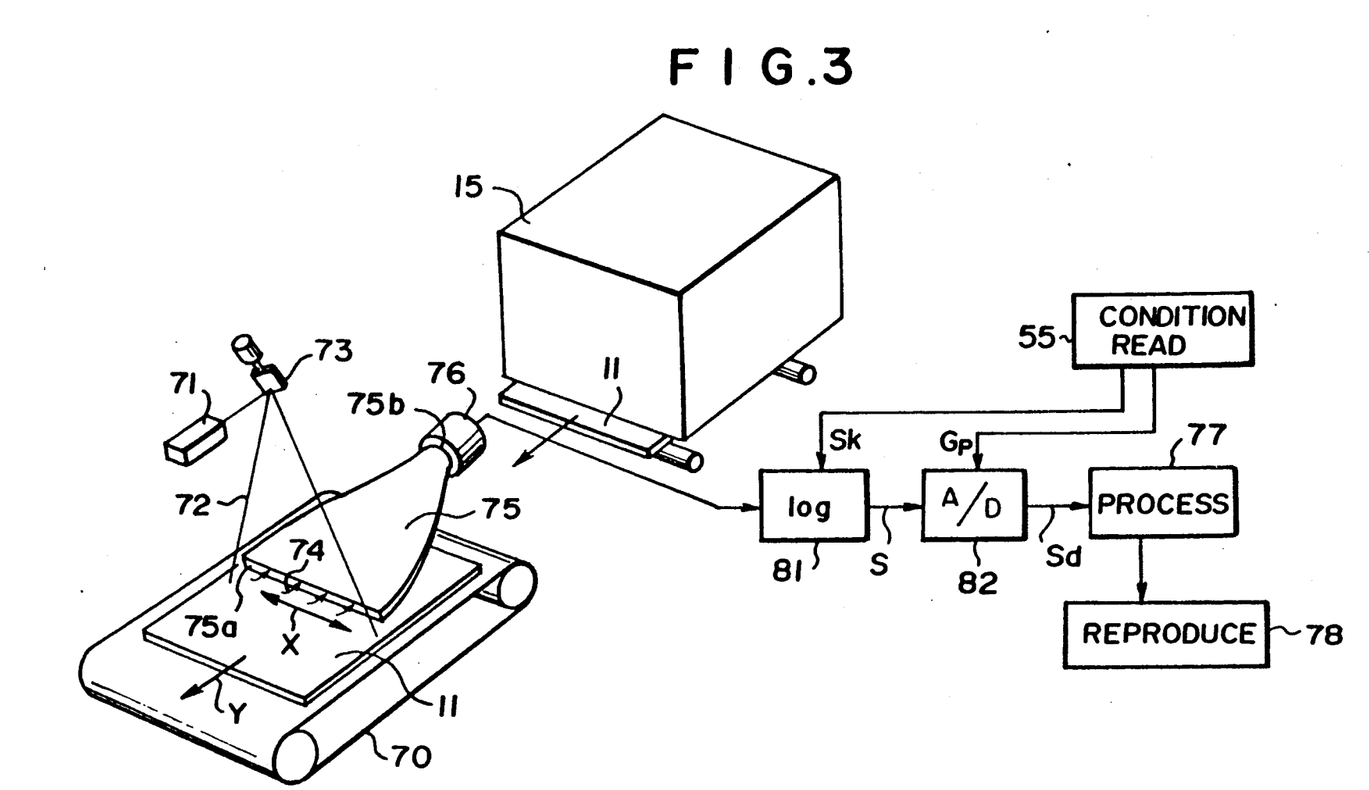
FIG. 3 is a schematic perspective view showing an electron microscope image read-out apparatus in the electron microscope image recording and reproducing system of FIG. 1.

With reference to FIG. 3, the stimulable phosphor sheets 11, 11, . . . are taken, one after another, out of the receiving magazine 15 which has been fitted into the electron microscope image read-out apparatus 80. Any of known means may be used for this purpose. A stimulable phosphor sheet 11 which has been taken out of the receiving magazine 15 is placed on a sheet conveyance means 70 which is constituted of, for example, an endless belt. Thereafter, a stimulating ray beam 72 is produced by a stimulating ray source 71 which may be constituted of an He-Ne laser or the like. The stimulating ray beam 72 is deflected by a light deflector 73, which may be constituted of a galvanometer mirror, or the like, and is caused to scan the stimulable phosphor sheet 11 in the main scanning directions indicated by the double-headed arrow X. At the same time, the stimulable phosphor sheet 11 is moved by the sheet conveyance means 70 in a sub-scanning direction indicated by the arrow Y, which direction is approximately normal to the main scanning directions. As a result, the whole surface of the stimulable phosphor sheet 11 is exposed to the stimulating ray beam 72. When the stimulable phosphor sheet 11 is exposed to the stimulating ray beam 72, it emits light 74 in proportion to the amount of energy stored thereon during its exposure to the electron beam 2. The emitted light 74 enters a light guide member 75 from its light input face 75a. The emitted light 74 which has entered the light guide member 75 is guided through repeated total reflection inside of the light guide member 75, radiated from a light output face 75b, and received by a photodetector 76 which may be a photomultiplier, or the like, and which is positioned so that it is in close contact with the light output face 75b of the light guide member 75. In this manner, the amount of the emitted light 74 is photoelectrically detected and converted into an electric signal by the photodetector 76. The electric signal generated by the photodetector 76 represents the level of energy stored on the stimulable phosphor sheet 11 during its exposure to the electron beam 2.

The system for the photoelectric detection and conversion of the emitted light 74 is not limited to the above-described system as shown in FIG. 3. For example an image read-out apparatus as disclosed in U.S. Pat. No. 4,886,968 can be used for the same purpose. In more detail, the radiation image read-out apparatus comprises a sheet holding device for holding an image-recorded stimulable phosphor sheet on a cylindrical surface, and a spinner provided with a deflection mirror for reflecting stimulating rays coming from a semi-transparent mirror to the stimulable phosphor sheet, and a condensing lens for converging the reflected stimulating rays on the stimulable phosphor sheet. The spinner rotates the deflection mirror and the condensing lens to scan the stimulating rays in a main scanning direction on the stimulable phosphor sheet, and the sheet holding device is moved normal to the main scanning direction. A detection lens converges light emitted by the stimulable phosphor sheet upon exposure to the stimulating rays, passing through the condensing lens and coming from the semi-transparent mirror. An aperture plate having an aperture allowing the passage of only the emitted light thus converged is provided at a position of convergence by the detection lens, and a photodetector is provided at the rear of the aperture plate.

By using this and other kinds of image read-out apparatus, the light emitted from the stimulable phosphor sheet is read out and the amount of the emitted light is converted to the electric signal.

The electric signal is logarithmically amplified into an analog read-out image signal S by a logarithmic amplifier 81. The analog read-out image signal S is digitized into a digital image signal Sd by an A/D converter 82. The scale factor used during the digitization and the read-out gain used in the logarithmic amplifier 81 are respectively set to the values Gp and Sk which are represented by the signal read by the condition reading device 55. The signals representing the read-out conditions, which signals were written for the respective stimulable phosphor sheets 11, 11, . . . , are read by the condition reading device 55 in reverse order from the order in which the signals representing the read-out conditions were written on the storage card 54 by the condition writing device 53. Therefore, the signal representing the read-out conditions determined for the stimulable phosphor sheet 11, which is the last stimulable phosphor sheets 11, 11, introduced into the receiving magazine 15 in the electron microscope image recording apparatus 10 and which is the first one to be subjected to the read-out operation, is first read from the storage card 54 by the condition reading device 55. Thereafter, the signals representing the read-out conditions determined for the respective stimulable phosphor sheets 11, 11, . . . are read by the condition reading device 55 and accurately associated with the corresponding stimulable phosphor sheets 11, 11, . . . Alternatively, the order in which the stimulable phosphor sheets 11, 11, . . . are taken out of the receiving magazine 15 may be changed so that the stimulable phosphor sheets 11, 11, . . . will be subjected to the read out operation in the order in which the signals corresponding to the stimulable phosphor sheets 11, 11, . . . were written by the condition writing device 53 (i.e. in the order in which the electron microscope images were recorded on the stimulable phosphor sheets 11, 11, . . . ).

The digital image signal Sd generated by the A/D converter 82 is fed into an image processing circuit 77 which carries out image processing on the digital image signal Sd. After being processed, the digital image signal Sd is fed into an image reproducing apparatus 78. The image reproducing apparatus 78 may be a display device such as a CRT, or may be a light beam scanning recording apparatus which records an image on a photosensitive film. Because the electric signal corresponding to the amount of the emitted light 74 is used to reproduce a visible image, the enlarged scattering image 8b which is represented by the emitted light 74 can be reproduced as a visible image.

With the embodiment described above, in the course of generating the digital image signal Sd, the read-out gain and the scale factor are set to appropriate values, which are determined by the read-out condition determining circuit 51 and based on the electron beam exposure amount for each stimulable phosphor sheet 11. Therefore, it is possible to reproduce a visible electron microscope image which has appropriate contrast and good image quality and which can serve as an effective tool in, particularly, the efficient and accurate analysis of a sample. In general, the read-out operation takes more time than the recording of an electron microscope image. However, with this embodiment, the read-out operation can be carried out quickly because no particular operation (for example, a preliminary readout) need be carried out in order to determine the read-out conditions.

In the aforesaid embodiment, the read-out conditions are determined only from the electron beam exposure amount. Alternatively, the read-out conditions may be determined from the electron beam exposure amount and other factors, for example, the acceleration voltage, the type of sample, and the type of the image recording method used (such as a method for recording an enlarged image or a diffraction image). Also, in the aforesaid embodiment, the mean current of the electron beam is employed in the calculation of the electron beam exposure amount. Alternatively, the current of the electron beam may be determined for each of a plurality of positions on a two-dimensional sensor, and a histogram, or the like, may be created from the values of the current determined for the plurality of positions. The current of the electron beam which is to be used in the calculation of the electron beam exposure amount may then be determined from the histogram or the like.

Also, in the aforesaid embodiment, the signals representing the read-out conditions determined for the respective two-dimensional sensors are written on a storage card 54 which is independent from the two-dimensional sensors. Alternatively, magnetic cards or the like may be secured to the respective two-dimensional sensors, and the signals representing the read-out conditions determined for the respective two-dimensional sensors may be written on the magnetic cards or the like.

Additionally, image processing conditions suitable for the electron microscope images stored on the respective two-dimensional sensors may also be based on the electron beam exposure amounts. Signals representing these image processing conditions may be stored on the storage card 54 or the like, and may thereafter be read from the storage card 54 or the like when the electron microscope images are to be reproduced as visible images.

Moreover, signals representing the image recording number, the name of sample, the enlargement factor, and other information may be stored for each image as well as the information, which is to be used in order to determine the read-out conditions and/or the image processing conditions. The information represented by these signals may be displayed when a visible image is reproduced.

In cases where thermal phosphor sheets are used instead of stimulable phosphor sheets, in order to heat the thermal phosphor sheets and release the energy stored thereon, a heat source, such as a $CO_2$ laser, which produces heat rays, may be used and the thermal phosphor sheets may be scanned with heat rays. For this purpose, reference may be made to, for example, Japanese Patent Publication No. 55(1980)-47720.

What is claimed is:

1. An electron microscope image recording and read-out method wherein each of a plurality of two-dimensional sensors capable of storing energy from an electron beam thereon is exposed to an electron beam, which has passed through a sample, in a vacuum in order to store the energy from the electron beam on a respective two-dimensional sensor, thereafter the respective two-dimensional sensor is exposed to light or heat in order to release the stored energy as emitted light, and the emitted light is photoelectrically detected in order to obtain an image signal which represents an electron microscope image of the sample, wherein the improvement comprises the steps of:
(i) for each of said plurality of two-dimensional sensors, determining read-out conditions, which are to be used in the course of detecting the emitted light, on the basis of an electron beam exposure amount which was set in the course of storing the energy from said electron beam on said two-dimensional sensor,
(ii) storing signals, which represent the read-out conditions determined from the respective two-dimensional sensors, in a storage means so that said read-out conditions clearly correspond to which two-dimensional sensor, and
(iii) in the course of exposing a two-dimensional sensor to light or heat and detecting the light emitted by said two-dimensional sensor, reading a signal, which represents the read-out conditions corresponding to said two-dimensional sensor, from said storage means, and setting said read-out conditions when the light emitted by said two-dimensional sensor is being detected.

2. A method as defined in claim 1 wherein a stimulable phosphor sheet is used as said two-dimensional sensor, said stimulable phosphor sheet is exposed to said electron beam, which has passed through said sample, in said vacuum in order to store the energy from said electron beam on said stimulable phosphor sheet, said stimulable phosphor sheet is then scanned with stimulating rays which cause it to emit light in proportion to the amount of energy stored thereon during its exposure to said electron beam, and the emitted light is detected photoelectrically.

3. A method as defined in claim 1 wherein a thermal phosphor sheet is used as said two-dimensional sensor, said thermal phosphor sheet is exposed to said electron beam, which has passed through said sample, in said vacuum in order to store the energy from said electron beam on said thermal phosphor sheet, said thermal phosphor sheet is then scanned with heat rays which cause it to release the energy, which has been stored thereon during its exposure to said electron beam, as thermal fluorescence, and the thermal fluorescence is detected photoelectrically.

4. A method as defined in claim 1 wherein said electron beam exposure amount is calculated from the multiplication of the mean current of said electron beam, which impinges upon said two-dimensional sensor, by a shutter open time for which a shutter, which is provided in the path of said electron beam in order to intercept said electron beam, is kept open.

5. An electron microscope image recording and read-out method according to claim 1, wherein said determining read-out conditions step is further based on an acceleration voltage, a type of sample, and a type of image recording method used.

6. A method as defined in claim 1, wherein said storing step is performed by storing said signals in a storage card.

7. A method as defined in claim 1, wherein said storing step is performed by storing said signals in a magnetic card secured to said each of said plurality of two-dimensional sensors.

8. An electron microscope image recording and read-out apparatus wherein each of a plurality of two-dimensional sensors capable of storing energy from an electron beam thereon is exposed to an electron beam, which has passed through a sample, in a vacuum in order to store the energy from the electron beam on a two-dimensional sensor, thereafter the two-dimensional sensor is exposed to light or heat in order to release the stored energy as emitted light, and the emitted light is photoelectrically detected in order to obtain an image signal which represents an electron microscope image of the sample, said system comprising:
determining means for determining read-out conditions for each of said plurality of two-dimensional sensors, said read-out conditions being used in the course of detecting the emitted light, on the basis of an electron beam exposure amount which was set in the course of storing the energy from said electron beam on said two-dimensional sensor;
storing means for storing said signals, which represent the read-out conditions determined for the respective two-dimensional sensors, and such that said read-out conditions being stored clearly correspond to said respective of two-dimensional sensors;
reading means for reading a signal, in the course of exposing a two-dimensional sensor to light or heat and detecting the light emitted by said two-dimensional sensor, which represents the read-out conditions corresponding to said two-dimensional sensor, from said storing means storing said signals, and
setting means for setting said read-out conditions when the light emitted by said two-dimensional sensor is being detected.

9. An apparatus as defined in claim 8, wherein a stimulable phosphor sheet is used as said two-dimensional sensor.

10. An apparatus as defined in claim 8 wherein a thermal phosphor sheet is used as said two-dimensional sensor.

11. An apparatus as defined in claim 8 wherein said electron beam exposure amount is calculated from the multiplication of the mean current of said electron beam, which impinges upon said two-dimensional sensor, by a shutter open time for which a shutter, which is provided in the path of said electron beam in order to intercept said electron beam, is kept open.

12. An apparatus as defined in claim 8, wherein said storing means comprises a storage card.

13. An apparatus as defined in claim 8, wherein said storing means comprises a magnetic card secured to said each of said plurality of two-dimensional sensors.

* * * * *